United States Patent
Rantala

(10) Patent No.: US 11,592,945 B2
(45) Date of Patent: Feb. 28, 2023

(54) DIELECTRIC SILOXANE PARTICLE FILMS AND DEVICES HAVING THE SAME

(71) Applicant: Inkron Oy, Espoo (FI)

(72) Inventor: Juha Rantala, Espoo (FI)

(73) Assignee: Inkron Oy, Espoo (FI)

( * ) Notice: Subject to any disclaimer, the term of this patent is extended or adjusted under 35 U.S.C. 154(b) by 385 days.

(21) Appl. No.: 15/766,852

(22) PCT Filed: Oct. 10, 2016

(86) PCT No.: PCT/FI2016/050710
§ 371 (c)(1),
(2) Date: Apr. 9, 2018

(87) PCT Pub. No.: WO2017/060574
PCT Pub. Date: Apr. 13, 2017

(65) Prior Publication Data
US 2018/0284331 A1    Oct. 4, 2018

(30) Foreign Application Priority Data

Oct. 9, 2015 (FI) .................................. 20155714

(51) Int. Cl.
*G06F 3/044* (2006.01)
*G02B 5/30* (2006.01)
(Continued)

(52) U.S. Cl.
CPC ............ *G06F 3/0445* (2019.05); *C09D 7/61* (2018.01); *C09D 7/67* (2018.01); *C09D 7/68* (2018.01);
(Continued)

(58) Field of Classification Search
CPC ....... G06F 3/0445; G06F 3/0412; C09D 7/61; C09D 7/67; C09D 7/68; C09D 7/70;
(Continued)

(56) References Cited

U.S. PATENT DOCUMENTS

| 7,267,875 B2 * | 9/2007 | Whiteford | .............. B82Y 30/00 427/372.2 |
| 7,274,458 B2 * | 9/2007 | Perez | .................... B82Y 15/00 250/227.16 |

(Continued)

FOREIGN PATENT DOCUMENTS

| EP | 2375452 A1 | 10/2011 |
| JP | 2005010470 A * | 1/2005 |

(Continued)

OTHER PUBLICATIONS

Anonymous: "Noble metal—Wikipedia", Mar. 27, 2020. XP055683524, Retrieved from the Internet: https://en.wikipedia.org/wiki/Noble_metal.

(Continued)

*Primary Examiner* — Nathan L Van Sell
(74) *Attorney, Agent, or Firm* — Laine IP Oy

(57) ABSTRACT

An optical coating has a siloxane polymer and noble metal particles. The coating has an index of refraction that is different for in-plane and out-of-plane. The coating has reverse optical dispersion within the visible wavelength range, and preferably a maximum absorption peak between 400-1000 nm wavelength range is greater than 700 nm. In one example the metal particles are noble metal nanorods having an average particle width of less than 400 nm.

15 Claims, 8 Drawing Sheets

(51) Int. Cl.

| | | |
|---|---|---|
| C09D 7/61 | (2018.01) | |
| C09D 7/40 | (2018.01) | |
| C09D 183/04 | (2006.01) | |
| G02F 1/1333 | (2006.01) | |
| G02F 1/1335 | (2006.01) | |
| G02F 1/13363 | (2006.01) | |
| G06F 3/041 | (2006.01) | |
| H01L 27/32 | (2006.01) | |

(52) U.S. Cl.
CPC .............. *C09D 7/70* (2018.01); *C09D 183/04* (2013.01); *G02B 5/3008* (2013.01); *G02B 5/3025* (2013.01); *G02B 5/3083* (2013.01); *G02F 1/13338* (2013.01); *G02F 1/13363* (2013.01); *G02F 1/133514* (2013.01); *G02F 1/133528* (2013.01); *G06F 3/0412* (2013.01); *H01L 27/322* (2013.01); *H01L 27/323* (2013.01); *G02F 1/133631* (2021.01)

(58) Field of Classification Search
CPC .. C09D 183/04; G02B 5/3008; G02B 5/3025; G02B 5/3083; G02F 1/13338; G02F 1/133514; G02F 1/133528; G02F 1/13363; G02F 2001/133631; H01L 27/322; H01L 27/323
See application file for complete search history.

(56) References Cited

U.S. PATENT DOCUMENTS

| | | | |
|---|---|---|---|
| 2007/0042174 A1* | 2/2007 | Rao | C08J 5/005 428/323 |
| 2008/0032134 A1* | 2/2008 | Whiteford | C09C 3/12 428/402.24 |
| 2009/0059368 A1 | 3/2009 | Kamada | |
| 2009/0209420 A1* | 8/2009 | Kalgutkar | B32B 5/16 503/201 |
| 2010/0003528 A1 | 1/2010 | Rozhin et al. | |
| 2010/0060827 A1 | 3/2010 | Kim et al. | |
| 2010/0246009 A1 | 9/2010 | Polley et al. | |
| 2011/0051064 A1 | 3/2011 | Matsumori et al. | |
| 2011/0098420 A1 | 4/2011 | Takizawa et al. | |
| 2012/0056211 A1 | 3/2012 | Kitagawa et al. | |
| 2015/0239023 A1* | 8/2015 | Iwata | B32B 27/18 428/141 |
| 2015/0240086 A1* | 8/2015 | Iwata | G02B 1/18 428/141 |
| 2015/0346580 A1* | 12/2015 | Williams | G02B 3/0043 359/326 |
| 2016/0096967 A1* | 4/2016 | Virkar | C09D 101/10 428/215 |
| 2016/0108256 A1* | 4/2016 | Yang | G02B 5/223 428/220 |
| 2016/0122562 A1* | 5/2016 | Yang | H01B 1/20 428/215 |
| 2016/0133349 A1* | 5/2016 | Cho | G06F 3/0412 428/196 |
| 2016/0200981 A1* | 7/2016 | Lee | G02B 5/3016 428/1.32 |
| 2016/0224140 A1* | 8/2016 | Matsuda | B32B 27/06 |
| 2016/0293288 A1* | 10/2016 | Hu | B32B 15/04 |
| 2016/0369104 A1* | 12/2016 | Gu | C09D 183/06 |

FOREIGN PATENT DOCUMENTS

| | | |
|---|---|---|
| JP | 2008101176 A | 5/2008 |
| JP | 2008156479 A | 7/2008 |
| JP | 2008176065 A | 7/2008 |
| JP | 2009075568 A | 4/2009 |
| JP | 2009256670 A | 11/2009 |
| JP | 2010163601 A | 7/2010 |
| JP | 2012134117 A | 7/2012 |
| JP | 2014167091 A | 9/2014 |
| JP | 2014531334 A | 11/2014 |
| KR | 20140021807 A | 2/2014 |
| WO | WO 2013189027 A1 | 12/2013 |

OTHER PUBLICATIONS

Stoenescu et al: Enhanced anisotropy of gold nanorods-polymer composite films for optical applications. Optical Sensing II, Oct. 15, 2012, vol. 8412, p. 8412T.

Tosaka et al: Gold nanoparticle/PDMS composite exhibiting anisotropic plasmonresonance. JNL of the Society of Materials Science, Jan. 1, 2013, pp. 13-17.

* cited by examiner

DIELECTRIC SILOXANE PARTICLE FILMS AND DEVICES HAVING THE SAME

TECHNICAL FIELD

The present invention relates to siloxane materials and devices containing the same. In particular, the present invention concerns optical coatings comprising siloxane polymers, displays, as well as optical films, and method of producing the same.

BACKGROUND

Polymer compositions are disclosed in US 2010003528, optical films in WO 2013189027, photorefractive polymer composite coatings are discussed in KR 20140021807, and display structures are disclosed in US 2011051064 and US 2010060827.

SUMMARY

It is an aim of the present invention to provide novel optical coatings comprising siloxane polymers.

It is another aim to provide novel display structures comprising arrays of pixels with optical coatings for color compensation.

The present invention is based on the concept of providing an optical coating which has a siloxane polymer and noble metal particles. The coating has an index of refraction that is different for in-plane and out-of-plane. The coating has reverse optical dispersion within the visible wavelength range, and preferably a maximum absorption peak between 400-1000 nm wavelength range is greater than 700 nm. In one example the metal particles are noble metal nanorods having an average particle width of less than 400 nm.

Thus, in one embodiment, an optical coating is provided which comprises a siloxane polymer and noble metal particles, wherein the coating has an index of refraction that is different for in-plane and out-of-plane.

In another embodiment a display is provided, comprising an array of pixels, and an optical coating for color compensation, widening of viewing angle and/or antireflection, wherein the optical coating comprises a siloxane polymer.

Still another embodiment provides an optical film with a polymer having metal particles therein with an average particle width of less than 400 nm, wherein the optical film has an optical dispersion that increases within the visible spectrum as the wavelength of light increases.

More specifically, the present invention is mainly characterized by what is stated in the characterizing parts of the independent claims.

The present invention provides considerable advantages. For example, the invention achieves a reverse optical dispersion material with high thermal stability and high glass transition temperature.

The present invention has a number of interesting uses. Thus, a siloxane particle composition of the present kind can deposited as a coating or film with reverse optical dispersion in semiconductor devices and microelectronic and optoelectronic devices. As will discussed below in more detail, applications include (but are not limited to) non-touchscreen displays and, in particular touchscreen displays. Examples of the latter include resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc as well as touchscreens in retail, commercial and industrial environments.

BRIEF DESCRIPTION OF THE DRAWINGS

Example embodiments will be more clearly understood from the following detailed description taken in conjunction with the accompanying drawings, in which.

DESCRIPTION OF EMBODIMENTS

Figure 1:
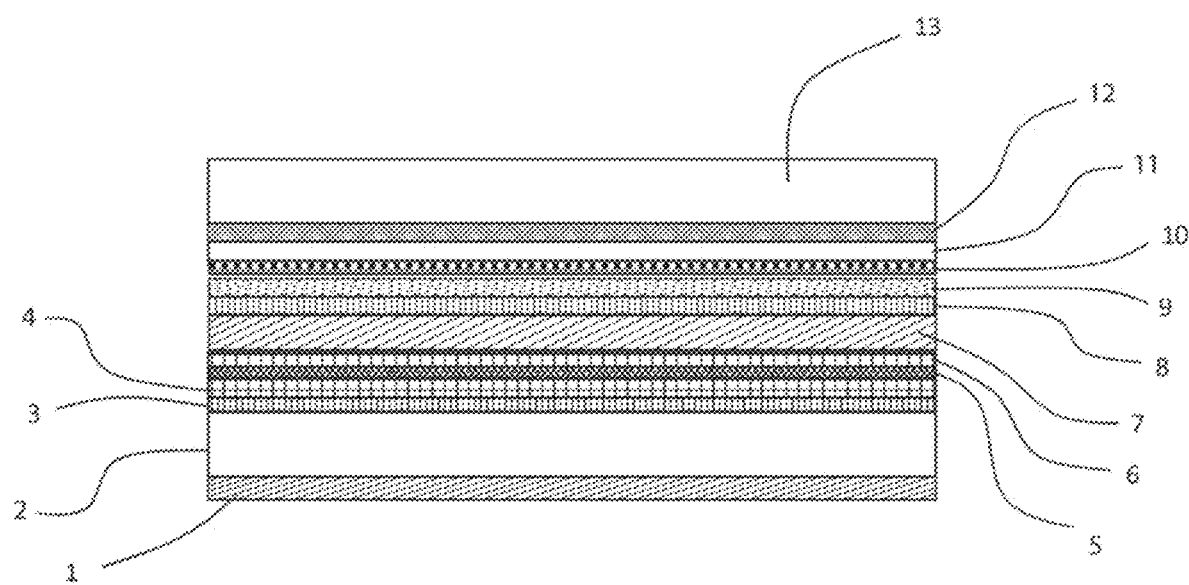
FIG. 1 is a cross sectional view of an on-cell touch capacitive panel display device.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It is noted that, as used herein, the singular forms of "a", "an" and "the" include plural referents unless the context clearly dictates otherwise. It will be further understood that the term "comprises" and/or "comprising", when used in this specification, specify the presence of stated features, steps, operations, elements, and/or components, but do not preclude the addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

One embodiment provides a siloxane particle composition that is optically transmissive in the visible spectrum and that can be deposited as a coating or film with reverse optical dispersion in semiconductor devices and microelectronic and optoelectronic devices, such as displays (e.g. LED displays such as OLED/AMOLED or LCD displays). In particular, though not limited thereto, the present embodiments are related to touchscreen displays, such as resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc as well as touchscreens in retail, commercial and industrial environments. However non-touchscreen versions of such products may also benefit from the siloxane particle film with reverse optical dispersion as disclosed herein.

In a resistive type touch screen, a flexible clear top substrate (e.g. a plastic film such as polyester) is disposed spaced apart from a more rigid bottom substrate (e.g. a glass substrate) with an air gap therebetween. When a user's finger touches the flexible top substrate, it deflects so as to make contact with the bottom substrate. The voltage at the point of contact can be measured and the location of the point of contact calculated. In a capacitive type touch panel, on the display (e.g. an array of LCD or LED pixels) is connected an additional substrate or substrates, which can be any suitable material such as glass, polyester, acrylic, etc. The substrate(s) have a matrix of electrically conducting lines with a dielectric layer therebetween. A top cover lens is bonded to enclose the whole assembly. When a user's finger touches the cover substrate, it increases the measured capacitance of the electrodes nearest to the point of touch, where the change in capacitance can be measured and used to calculate the location of the touch. Surface capacitive or projected capacitive examples can both be used in LED displays, including OLED displays (including e.g. AMO-LED displays).

FIG. 1 is a cross sectional view of an on-cell touchscreen capacitive type display. As can be seen in this figure, a substrate 2, which can be a suitable transparent substrate such as glass or polymer, has a polarizer layer 1 thereon. Formed on the glass is a thin film transistor array 3, and an array of liquid crystal cells 4. Thereon is disposed VCOM layer 5 (common electrode) and color filters 6 on glass substrate 7. The touch sensitive portion of the device is formed of a patterned electrically conductive layer 8, insulating layer 9 and patterned electrically conductive layer 10. In patterned layer 10, the pattern lines come out of the page, whereas in layer 8, the patterns run orthogonally to the lines in layer 10 (i.e. horizontally in a left-right direction on the page). Positioned between the two electrically conductive layers 8 and 10 is dielectric layer 9. A second polarizer is shown as layer 11, and a cover glass 13 is bonded to the rest of the structure via adhesive layer 12.

Figure 2:
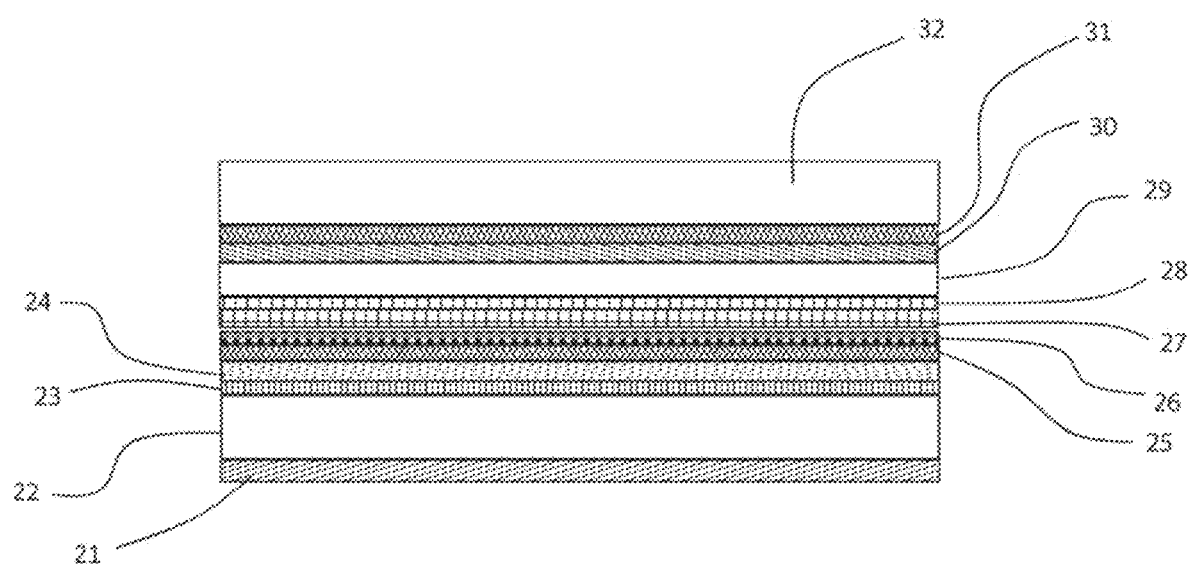
FIG. 2 is a cross sectional view of an in-cell capacitive touch panel display device.

FIG. 2 is a cross sectional view of an in-cell touchscreen capacitive type display. As can be seen in FIG. 2, on glass substrate 22 is provided a polarizing layer 21 and a thin film transistor array 23. Thereon is provided the capacitive touchscreen portion of the display, where an electrically conductive layer 24, and an electrically conductive layer 26 have therebetween an insulating layer 25. In this example, the patterned electrical lines in layer 26 are coming out of the page, whereas the patterned lines of layer 24 run horizontally, left to right on the page. Also illustrated is a layer of LCD cells 27, and color filters 28 on transparent substrate 29. Additionally provided are a polarizing layer 30 and an adhesive layer 31 for bonding an additional transparent substrate 32 on top. The transparent substrates in FIGS. 1 and 2 can independently made of glass or polymer (polyester/polyethylene terephthalate, acrylic/polymethyl methacrylate, etc) or other suitable light transmissive substrate.

Figure 3:
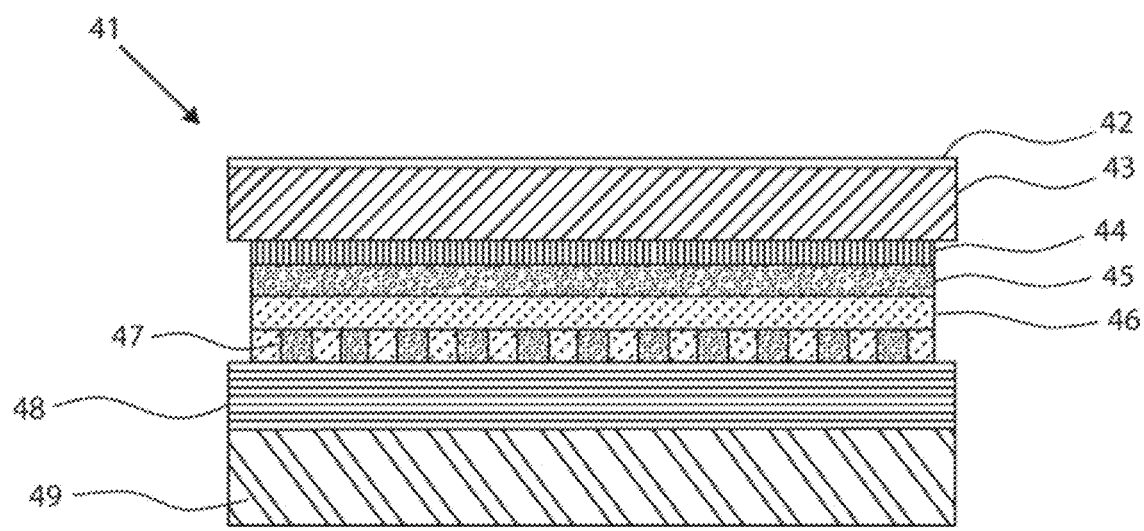
FIG. 3 is a simplified view of a touch panel display device.

As can be seen in FIG. 3, a cross section of an exemplary capacitive touch display 1 is illustrated in amplified form. As shown in FIG. 3, 9 is a simplified view of the liquid crystal display layers (liquid crystal material, color filters, supporting substrate(s) etc.). Disposed thereon is a light transmissive substrate 8, which can be any suitable material such as glass, polyester, acrylic etc. On substrate 8 are electrically conductive patterns 7, which are lines extending out of the plane of FIG. 3. These conductive bands extend across the length of the display. Formed on the conductive bands is a capacitor layer—an insulating layer 6, which can be deposited so as to fill in the spaces between the conductive bands 7 and form an insulating layer above. Both the electrically conducting bands 7 and dielectric layer 6 should be transmissive to visible light, preferably each transmitting at least 70% of visible light incident thereon, though more preferably at least 80%, and more preferably at least 90%, at least 92.5%, or at least 95%.

As can further be seen in FIG. 3, an additional layer of patterned electrically conductive bands 5 are provided. In this case, the conductive bands are formed as strips extending perpendicularly (or otherwise not parallel) to the bands 7 on the opposite side of dielectric layer 5. Conductive lines 5 can be the driving lines of the display and conductive lines 7 can be the sensing lines. Also shown is an upper light transmissive substrate 3, which can be glass, polyester, acrylic or other suitable material that is transmissive to light in the visible spectrum. Substrate 3 is adhered via adhesive 4, which should also be transmissive to visible light.

Figure 4:
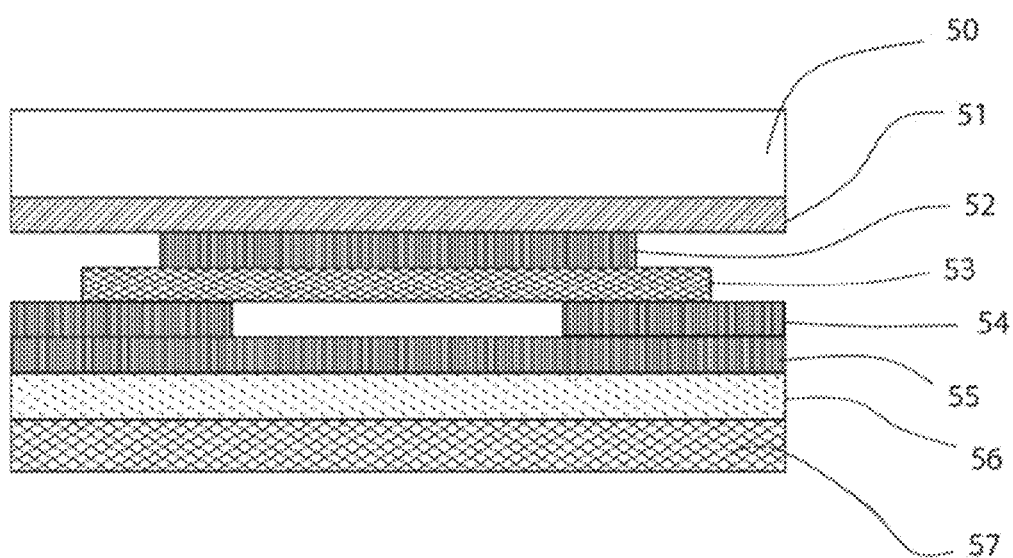
FIG. 4 is a cross sectional view of an on-glass capacitive touch panel display device.

An on-glass touch screen display is illustrated in cross section in FIG. 4. As shown in FIG. 4, on a light transmissive substrate 50, is disposed a transparent electrically conducting layer 51, an electrically conductive jumper 52, and a dielectric layer 53 (e.g. a UV cured insulating layer). Also illustrated are metal traces 54, an electrically conductive pattern 55, passivation layer 56 and an additional dielectric over coat 57. Layer 52 can be deposited at high temperature, with layer 55 deposited at a low temperature.

Figure 5:
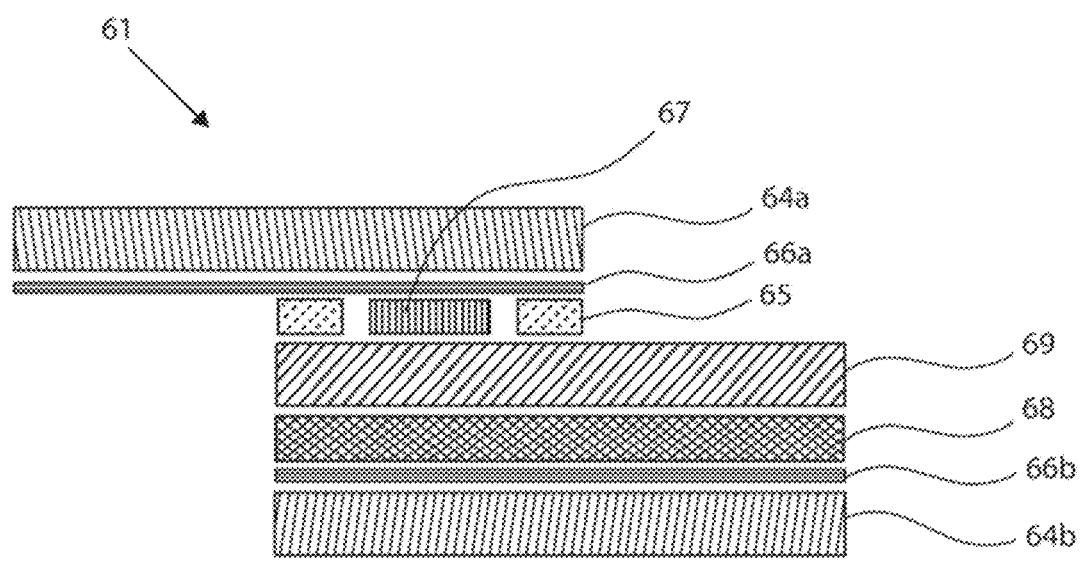
FIG. 5 is an expanded cross sectional view of a light emitting diode pixel.

As can be seen in FIG. 5, an expanded view of a simplified organic light emitting diode 61 (OLED) is illustrated. Substrates 64a and 64b are glass or other suitable material. 68 is a hole transport layer emitting layer (e.g. MEH-PPV-(poly[2-methoxy-5-(2'-ethyl-hexyloxy)-1,4-phenylene vinylene])). 65 in FIG. 2 is a sealant or adhesive, whereas 67 is the cathode (e.g. GaIn). Layers 66a and 66b are the electrically conductive light transmissive layers, e.g. siloxane particle conductive layers or ITO layers. 66b can act as the anode of the OLED pixel. It is also possible that only substrate 64a is optically transmissive to visible light, whereas substrate 64b is not optically transmissive (substrate 64b may be an amorphous silicon or polycrystalline silicon substrate that has formed thereon a thin film transistor array, such as in one type of amoled pixel. In one example, the anode is formed of a first material on a glass substrate, and the cathode is formed from a different material on the other glass substrate. In another example, the anode is formed within the TFT area on the silicon substrate and the cathode is formed on the opposing glass substrate. The OLED display can be a traditional OLED display, but also can be a flexible OLED display.

Figure 6:
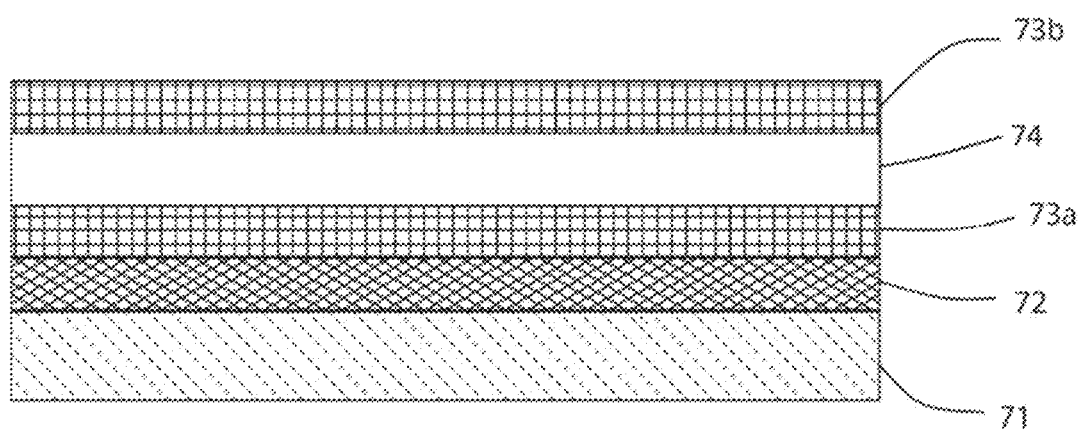
FIG. 6 is a cross sectional view of a liquid crystal display device with retardation film.

Regardless of the type of display or other optical device, it may be desirable to incorporate a coating or film formed from a reverse optical dispersion material with high thermal stability and high glass transition temperature. As can be seen in FIG. 6, layer 71 is a layer having an array of liquid crystal cells. Thereon is a retardation film 72, a polarizer 74 and two protection layers on either side of the polarizer 73a and 73b. Optical retardation film 72 is used to improve the contrast and viewing-angle of the display. Film 72 helps to control the three-dimensional refractive indices and the wavelength dispersion of the birefringence. Retardation film 72 is used as a polarization transformation material to improve the image quality of flat panel displays (FPDs) and OLEDs. An important feature of the retardation film and components are that they offer uniform retardation over the wavelength spread of the visible spectrum. The retardation film has functions such as color compensation, widening of viewing angle and antireflection.

Although there are various of retardation coatings and films available in commercial devices, their target display applications are limited to LCDs. Making a retardation film for OLED fabrication can be more challenging due to its high temperature treatment process.

As disclosed herein, a reverse optical dispersion material with high thermal stability and high glass transition temperature is achieved. Desired properties of the retardation film are achieved by using a siloxane polymer with controllable optical birefringence, and controllable reverse optical dispersion by incorporation of noble metal particles e.g. nanoparticles into the siloxane polymer with optical absorption at far red or near infrared wavelength region. One desired nanoparticle type is a metal nanoparticle, such as a noble metal nanoparticle, e.g. a gold nanorod. The nanorod may have a width of 5-50 nm and length of 10-200 nm. These gold nanorods can be also coated siloxone polymer coating, silicon dioxide coating, silane capping agents or titane capping agents.

The siloxane polymer according to the innovation can be also a composition derived from siloxane monomers and metal oxide monomers or siloxane monomers metal oxide nanoparticles. The siloxane polymer and the matrix for an additional birefringence and optical dispersion control agents exhibits normally low birefringence and birefringence is less than 0.01, typically less than 0.005, and preferably less than 0.001. The siloxane polymer can also comprise a co-polymer and blend polymer solution of side chained polymer in order to further control optical birefringence of the coatings.

The reverse dispersion of the film or coating is controlled at least in part via size, aspect ratio and concentration of noble metal nanoparticles. Typical concentration of the gold nano rod particles in final coating layer is 0.5 g/m$^2$ or less and more preferably 0.1 g/m$^2$ or less. The material can coated directly on a device such as OLED display or LCD-TFT display, on an optical film or an optical film component such as retardation film, polarizer film or brightness enhancement film.

According to the disclosure herein, the desired optical properties can be also achieved by using more than one optical material coating layers of the invented compositions with different index of refractions and optical dispersion. One or more of these layers can be also patterned and most preferably patterned via UV embossing process. The resulting coating or film has different index refraction for in-plane and out-of-plane. It is preferable that index of refraction difference increases as a function of increasing wavelength.

Resulting coatings and films have high thermal stability and or high thermal glass transition temperature that withstand post process temperature over 150° C., preferably over 200° C., or more preferably higher than 250° C. According to the invention the coating, film or component has optical transmission over 80%, typically over 85%, and more typically over 90% at visible wavelength range and with a haze below 1%. Average index of refraction range for the resulting coating according of the invention is from 1.2 to 2.0 at 632.8 nm wavelength range. Also the coating has co-efficiency of thermal expansion below 200 ppm/° C. or more preferably below 100 ppm/° C.

Optical coating of the invention can be coated over plastic or glass substrate. The non-limiting plastic surface or film can be PET, TAC, PC, PMMA, polyimide, epoxy, silicone, PSU, PS and any combination, stack or blend of previous. According to the invention use of the coating and coatings according to the innovation are favorable but not limited to polarizer, antireflection, contrast enhancement, brightness enhancement and optical performance coatings, films and devices in displays, sensors, lighting, light refection, heat reflection and photochromic and electrochromic devices.

Figure 7:
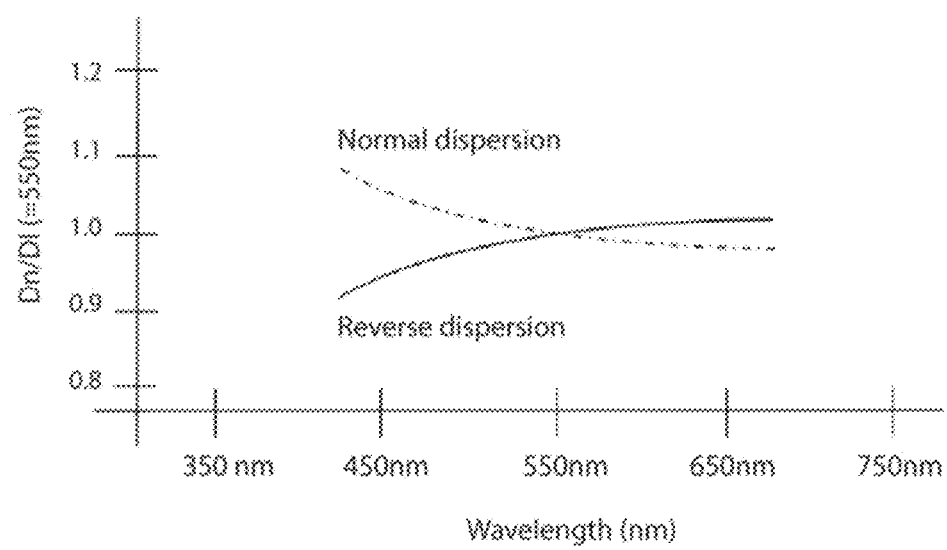
FIG. 7 is a graph of the reverse dispersion of the retardation film.

As can be seen in FIG. 7, a feature of the coating or film is that the value D is increasing at the visible wavelength region as a function of increasing wavelength. The value D is described as follows as Dn/Dl (at 550 nm wavelength range); where in Dn is in-plane and out-of-plane index of refraction difference and Dl is wavelength difference at 550 nm wavelength range.

Though no solvent is necessary for the application of the siloxane composition, if very thin layers are desired, it may be desirable to add an organic solvent, non polar or polar (protic or aprotic), so as to provide the siloxane material as a low viscosity liquid in order to minimize the deposited layer's thickness. Lowering the molecular weight of the siloxane polymer that is part of the composition, or using monomers (e.g. the first, second and/or third compounds) in place of the siloxane polymer in the composition, can lower the viscosity and aid in minimizing the film thickness (and thus increase light transmissivity) if desired. Surfactants and UV sensitive additives that enable the siloxane composition to react upon exposure to UV light can be added. Selecting the functional reactive group as acrylate can aid in polymerization under UV light.

Figure 8A:
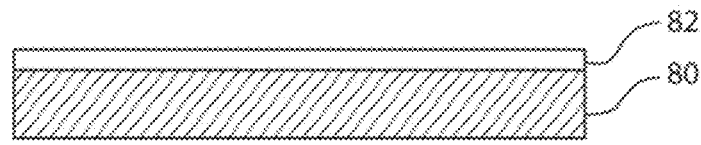
FIGS. 8a to 8d illustrate one method of UV patterning the retardation film.

As can be seen in FIGS. 8a to 8d, a UV patternable deposition method is illustrated. In FIG. 8a, a substrate 80 can be provided that is any suitable substrate such as glass, quartz, sapphire, polymer, semiconductor, ceramic, metal, etc. On substrate 70 is deposited a siloxane composition as disclosed herein and preferably comprising particles as disclosed hereinabove. The siloxane particle composition can be deposited as a fluid, e.g. a liquid or gel, preferably dispensed by a process such as syringe deposition or screen printing. Other deposition methods could be used, such as spin-on, dip, ink-jet, curtain, drip, roller, gravure, reverse offset, extrusion coating, slit coating, spray coating, flexographic, etc. Also, substrate 80 may or may not have been singulated from a wafer, but could instead be a whole wafer, or a portion cut from large sheets, such as large glass sheets used for display panels, solar cells, or the like. Depositing on large sheets in a roll to roll process is possible. Furthermore, substrate 80 could be adhered to the support substrate at the wafer level, with both the substrates singulated together into individual die. For displays or photovoltaic cells, preferred is a deposition method that can be incorporated into a roll to roll process.

Figure 8B:
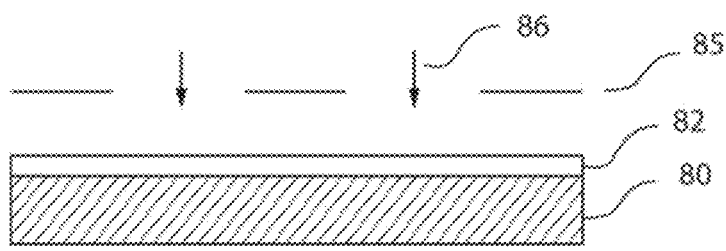
Figure 8C:
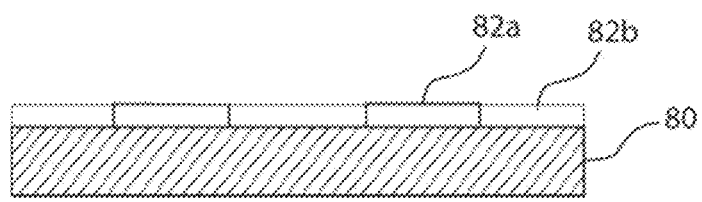
Figure 8D:
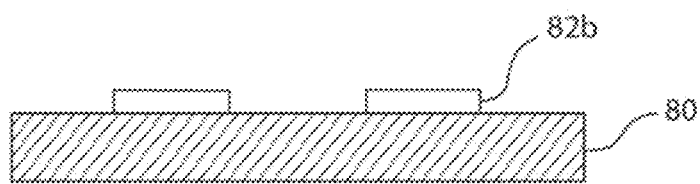

As can be seen in FIG. 8b, a mask 75 is disposed adjacent the siloxane layer and UV light is provided to the siloxane layer via apertures in the mask. The UV light cures and hardens the siloxane layer in the exposed areas 82a, whereas the unexposed areas 82b remain soft, as illustrated in FIG. 8c. As can be seen in FIG. 8d, a developer is used to remove unexposed areas 82b leaving pattern 82a in place. Various baking or drying steps may be used, such as a soft bake after initial application of the siloxane material 82, and a hard bake after removal of the unexposed areas 82b.

As an alternative to using a mask to directly pattern the siloxane material as discussed above, it is also possible to pattern the siloxane material via a photoresist layer deposited thereon. In such a process, after deposition and soft bake of the siloxane layer, a photoresist layer is deposited thereon. After a pattern is formed within the photoresist material, the pattern acts as a mask for UV exposing selectively the underlying siloxane material, so as to ultimately form a patterned siloxane layer. Alternatively UV embossing can be used to form a pattern in the siloxane material. A liquid/gel/semi-solid siloxane material is pressed against a mold, UV light is used to harden the siloxane polymer, after which the mold is removed.

Also, the siloxane retardation layer can be provided as a solid film, not patterned, but simply exposed to UV light for curing as a continuous film. The film can be crosslinked by UV only without any heat being applied, or it can be curable with a combination of UV and heat, or heat alone. The siloxane composition may comprise coupling agents, curing agents, antioxidants, adhesion promoters and the like, as disclosed herein. In particular, the siloxane material comprises reactive groups on the Si-O backbone that are reactive upon the application of incident UV light. The developer can be any suitable developer, such as TMAH, KOH, NaOH etc. It is also possible to pattern the siloxane material with laser patterning, instead of UV light.

An alternative method of forming the patterned retardation layer, it is possible to first deposit the particles onto a substrate separately from the siloxane material. In such a case, the particles can be deposited in an organic solvent or aqueous solvent solution or other carrier to form a nanoparticle (e.g. nanowire) layer on the substrate. After drying or other suitable method for removing the solvent, a particle 'film' remains. Thereon is deposited the siloxane material as disclosed herein. The siloxane material can be deposited with a solvent, with further drying and polymerization (e.g. application of heat and/or UV light) of the siloxane, to form a combined finally cured siloxane particle layer. Or the siloxane can be deposited without any added solvent at a desired molecular weight that provides the desired viscosity, followed by application of heat or UV light to harden and cure the siloxane material. It is also possible to provide silicon containing monomers at this stage (e.g. the first compound, second compound, or other optional components e.g. optional third compound, coupling agents etc) followed by the application of heat and/or UV light to the layer comprising the particles and polymerized siloxane.

More particularly with regard to the siloxane particle composition referred to hereinabove, a composition is made where a siloxane polymer is provided. Preferably the polymer has a silicon oxide backbone, with aryl (or alkyl) substituents as well as functional cross-linking substituents. A filler material is mixed with the siloxane polymer. The filler material is preferably particulate material comprising particles having an average particle size of 100 microns or less, preferably 10 microns or less. A catalyst is added, the catalyst being reactive with the functional cross-linking groups in the siloxane polymer when heat or UV light (or other activation method) is provided to the composition. A monomeric (or oligomeric) coupling agent(s) are included in the composition, preferably having functional cross-linking groups that are likewise reactive upon the application of heat or light as in the siloxane polymer. Additional materials such as stabilizers, antioxidants, dispersants, adhesion promoters, plasticizers, softeners, and other potential components, depending upon the final use of the composition, can also be added. Though a solvent could be added, in a preferred embodiment the composition is solvent-free and is a viscous fluid without solvent which is stored and shipped as such.

As noted above, the composition being made as disclosed herein, comprises a siloxane polymer. To make the siloxane polymer, a first compound is provided having a chemical formula $SiR^1aR^24-a$ where a is from 1 to 3, $R^1$ is a reactive group, and $R^2$ is an alkyl group or an aryl group. Also provided is a second compound that has the chemical formula $SiR^3bR^4cR^54-(b+c)$ where $R^3$ is a cross-linking functional group, $R^4$ is a reactive group, and $R^5$ is an alkyl or aryl group, and where b=1 to 2, and c=1 to (4-b). An optional third compound is provided along with the first and second compounds, to be polymerized therewith. The third compound may have the chemical formula $SiR^9fR^{10}g$ where $R^9$ is a reactive group and f=1 to 4, and where $R^{10}$ is an alkyl or aryl group and g=4-f. The first, second and third compounds may be provided in any sequence, and oligomeric partially polymerized versions of any of these compounds may be provided in place of the above-mentioned monomers.

The first, second and third compounds, and any compounds recited hereinbelow, if such compounds have more than one of a single type of "R" group such as a plurality of aryl or alkyl groups, or a plurality of reactive groups, or a plurality of cross-linking functional groups, etc., the multiple R groups are independently selected so as to be the same or different at each occurrence. For example, if the first compound is $SiR^1 2R^2 2$, the multiple $R^1$ groups are independently selected so as to be the same or different from each other. Likewise the multiple $R^2$ groups are independently selected so as to be the same or different from each other. The same is for any other compounds mentioned herein, unless explicitly stated otherwise.

A catalyst is also provided. The catalyst may be a base catalyst, or other catalyst as mentioned below. The catalyst provided should be capable of polymerizing the first and second compounds together. As mentioned above, the order of the addition of the compounds and catalyst may be in any desired order. The various components provided together are polymerized to create a siloxane polymeric material having a desired molecular weight and viscosity. After the polymerization, particles, such as microparticles, nanoparticles or other desired particles are added, along with other optional components such as coupling agents, catalyst, stabilizers, adhesion promoters, and the like. The combination of the components of the composition can be performed in any desired order.

More particularly, in one example, a siloxane polymer is made by polymerizing first and second compounds, where the first compound has the chemical formula $SiR^1 aR^2 4-a$ where a is from 1 to 3, $R^1$ is a reactive group, and $R^2$ is an alkyl group or an aryl group, and the second compound has the chemical formula $SiR^3 bR^4 cR^5 4-(b+c)$ where $R^3$ is a cross-linking functional group, $R^4$ is a reactive group, and $R^5$ is an alkyl or aryl group, and where b=1 to 2, and c=1 to (4-b).

The first compound may have from 1 to 3 alkyl or aryl groups ($R^2$) bound to the silicon in the compound. A combination of different alkyl groups, a combination of different aryl groups, or a combination of both alkyl and aryl groups is possible. If an alkyl group, the alkyl contains preferably 1 to 18, more preferably 1 to 14 and particularly preferred 1 to 12 carbon atoms. Shorter alkyl groups, such as from 1 to 6 carbons (e.g. from 2 to 6 carbon atoms) are envisioned. The alkyl group can be branched at the alpha or beta position with one or more, preferably two, C1 to C6 alkyl groups. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl, are particularly preferred. A cyclic alkyl group is also possible like cyclohexyl, adamantyl, norbornene or norbornyl.

If $R^2$ is an aryl group, the aryl group can be phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated). If the aryl group is a polyaromatic group, the polyaromatic group can be for example anthracene, naphthalene, phenanthere, tetracene which optionally can bear 1-8 substituents or can be also optionally 'spaced' from the silicon atom by alkyl, alkenyl, alkynyl or aryl groups containing 1-12 carbons. A single ring structure such as phenyl may also be spaced from the silicon atom in this way.

The siloxane polymer is made by performing a polymerization reaction, preferably a base catalyzed polymerization reaction between the first and second compounds. Optional additional compounds, as set forth below, can be included as part of the polymerization reaction.

The first compound can have any suitable reactive group $R^1$, such as a hydroxyl, halogen, alkoxy, carboxyl, amine or acyloxy group. If, for example, the reactive group in the first compound is an —OH group, more particular examples of the first compound can include silanediols such as diphenylsilanediol, dimethylsilanediol, di-isopropylsilanediol, di-n-propylsilanediol, di-n-butylsilanediol, di-t-butylsilanediol, di-isobutylsilanediol, phenylmethylsilanediol and dicyclohexylsilanediol among others.

The second compound can have any suitable reactive group $R^4$, such as a hydroxyl, halogen, alkoxy, carboxyl, amine or acyloxy group, which can be the same or different from the reactive group in the first compound. Group $R^5$, if present at all in the second compound, is independently an alkyl or aryl groups such as for group $R^2$ in the first compound. The alkyl or aryl group $R^5$ can be the same or different from the group $R^2$ in the first compound.

The cross-linking reactive group $R^3$ of the second compound can be any functional group that can be cross-linked by acid, base, radical or thermal catalyzed reactions. These functional groups can be for example any epoxide, oxetane, acrylate, alkenyl or alkynyl group.

If an epoxide group, it can be a cyclic ether with three ring atoms that can be cross-linked using acid, base and thermal catalyzed reactions. Examples of these epoxide containing cross-linking groups are glycidoxypropyl and (3,4-Epoxycyclohexyl)ethyl) groups to mention few If an oxetane group, it can be a cyclic ether with four ring atoms that can be cross-linked using acid, base and thermal catalyzed reactions. Examples of such oxetane containing silanes include 3-(3-ethyl-3-oxetanylmethoxy)propyltriethoxysilane, 3-(3-Methyl-3-oxetanylmethoxy)-propyltriethoxysilane, 3-(3-ethyl-3-oxetanylmethoxy)propyltrimethoxysilane or 3-(3-Methyl-3-oxetanylmethoxy) propyltrimethoxysilane, to mention a few.

If an alkenyl group, such a group may have preferably 2 to 18, more preferably 2 to 14 and particularly preferred 2 to 12 carbon atoms. The ethylenic, i.e. two carbon atoms bonded with double bond, group is preferably located at the position 2 or higher, related to the Si atom in the molecule. Branched alkenyl is preferably branched at the alpha or beta position with one and more, preferably two, C1 to C6 alkyl, alkenyl or alkynyl groups, optionally fluorinated or per-fluorinated alkyl, alkenyl or alkynyl groups.

If an alkynyl group, it may have preferably 2 to 18, more preferably 2 to 14 and particularly preferred 2 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, optionally per-fluorinated alkyl, alkenyl or alkynyl groups.

If a thiol group, it may be any organosulfur compound containing carbon bonded sulfhydryl group. Examples of thiol containing silanes are 3-mercaptopropyltrimethoxysilane and 3-mercaptopropyltriethoxysilane.

The reactive group in the second compound can be an alkoxy group. The alkyl residue of the alkoxy groups can be linear or branched. Preferably, the alkoxy groups are comprised of lower alkoxy groups having 1 to 6 carbon atoms, such as methoxy, ethoxy, propoxy and t-butoxy groups. A particular examples of the second compound is an silane, such as 2-(3,4-Epoxycyclohexyl)ethyltrimethoxysilane, 2-(3,4-epoxycyclohexyl)ethyltriethoxysilane, 3-(Trimethoxysilyl)propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane, 3-acryloxypropyltrimethoxysilane, among others.

A third compound may be provided along with the first and second compounds, to be polymerized therewith. The third compound may have the chemical formula $SiR9fR10g$ where R9 is a reactive group and f=1 to 4, and where R10 is an alkyl or aryl group and g=4−f. One such example is tetramethoxysilane. Other examples include phenylmethyldimethoxysilane, trimethylmethoxysilane, dimethyldimethoxysilanesilane, vinyltrimethoxysilane, allyltrimethoxysilane, methyltrimethoxysilane, methyltriethoxysilane, methyl tripropoxysilane, propylethyltrimethoxysilane, ethyltriethoxysilane, vinyltrimethoxysilane, vinyltriethoxysilane, among others.

Though the polymerization of the first and second compounds can be performed using an acid catalyst, a base catalyst is preferred. The base catalyst used in a base catalyzed polymerization between the first and second compounds can be any suitable basic compound. Examples of these basic compounds are any amines like triethylamine and any barium hydroxide like barium hydroxide, barium hydroxide monohydrate, barium hydroxide octahydrate, among others. Other basic catalysts include magnesium oxide, calcium oxide, barium oxide, ammonia, ammonium perchlorate, sodium hydroxide, potassium hydroxide, imidazone or n-butyl amine. In one particular example the base catalyst is $Ba(OH)_2$. The base catalyst can be provided, relative to the first and second compounds together, at a weight percent of less than 0.5%, or at lower amounts such as at a weight percent of less than 0.1%.

Polymerization can be carried out in melt phase or in liquid medium. The temperature is in the range of about 20 to 200° C., typically about 25 to 160° C., in particular about 40 to 120° C. Generally polymerization is carried out at ambient pressure and the maximum temperature is set by the boiling point of any solvent used. Polymerization can be carried out at refluxing conditions. Other pressures and temperatures are also possible. The molar ratio of the first compound to the second compound can be 95:5 to 5:95, in particular 90:10 to 10:90, preferably 80:20 to 20:80. In a preferred example, the molar ratio of the first compound to the second compound (or second plus other compounds that take part in the polymerization reaction—see below) is at least 40:60, or even 45:55 or higher.

In one example, the first compound has —OH groups as the reactive groups and the second compound has alkoxy groups as the reactive groups. Preferably, the total number of —OH groups for the amount of the first compound added is not more than the total number of reactive groups, e.g. alkoxy groups in the second compound, and preferably less than the total number of reactive groups in the second compound (or in the second compound plus any other compounds added with alkoxy groups, e.g. an added tetramethoxysilane or other third compound involved in the polymerization reaction, ad mentioned herein). With the alkoxy groups outnumbering the hydroxyl groups, all or substantially all of the —OH groups will react and be removed from the siloxane, such as methanol if the alkoxysilane is a methoxysilane, ethanol if the alkoxysilane is ethoxysilane, etc. Though the number of —OH groups in the first compound and the number of the reactive groups in the second compound (preferably other than —OH groups) can be substantially the same, it is preferably that the total number of reactive groups in the second compound outnumber the —OH groups in the first compound by 10% or more, preferably by 25% or more. In some embodiments the number of second compound reactive groups outnumber the first compound —OH groups by 40% or more, or even 60% or more, 75% or more, or as high as 100% or more. The methanol, ethanol or other byproduct of the polymerization reaction depending upon the compounds selected, is removed after polymerization, preferably evaporated out in a drying chamber.

The obtained siloxane polymers have any desired (weight average) molecular weight, such as from 500 to 100,000 g/mol. The molecular weight can be in the lower end of this range (e.g., from 500 to 10,000 g/mol, or more preferably 500 to 8,000 g/mol) or the organosiloxane material can have a molecular weight in the upper end of this range (such as from 10,000 to 100,000 g/mol or more preferably from 15,000 to 50,000 g/mol). It may be desirable to mix a polymer organosiloxane material having a lower molecular weight with an organosiloxane material having a higher molecular weight.

The obtained siloxane polymer may then be combined with additional components depending upon the final desired use of the polymer. Preferably, the siloxane polymer is combined with a filler to form a composition, such as a particulate filler having particles with an average particle size of less than 100 microns, preferably less than 50 microns, including less than 20 microns. Additional components may be part of the composition, such as catalysts or curing agents, one or more coupling agents, dispersants, antioxidants, stabilizers, adhesion promoters, and/or other desired components depending upon the final desired use of the siloxane material. In one example, a reducing agent that can reduce an oxidized surface to its metallic form, is included. A reducing agent can remove oxidation from particles if they are metallic particles with surface oxidation, and/or remove oxidation from e.g. metallic bonding pads or other metallic or electrically conductive areas that have oxidized, so as to improve the electrical connection between the siloxane particle material and the surface on which it is deposited or adhered. Reducing or stabilization agents can include ethylene glycol, beta-D-glucose, poly ethylene oxide, glycerol, 1,2-propylene glycol, N,N dimethyl formamide, poly-sodium acyrylate (PSA), betacyclodextrin with polyacyrylic acid, dihydroxy benzene, poly vinyl alcohol, 1,2-propylene glycol, hydrazine, hydrazine sulfate, Sodium borohydride, ascorbic acid, hydroquinone family, gallic acid, pyrogallol, glyoxal, acetaldehyde, glutaraldehyde, aliphatic dialdehyde family, paraformaldehyde, tin powder, zinc powder, formic acid. An additive such as a stabilization agent, e.g. an antioxidant such as Irganox (as mentioned hereinbelow) or a diazine derivative can also be added.

Cross-linking silicon or non-silicon based resins and oligomers can be used to enhance cross linking between siloxane polymers. The functionality of added cross-linking oligomer or resin is chosen by functionality of siloxane polymer. If for example epoxy based alkoxysilanes were used during polymerization of siloxane polymer, then epoxy functional oligomer or resin can be used. The epoxy oligomer or resin can be any di, tri, tetra, or higher functionality epoxy oligomer or resin. Examples of these epoxy oligomers or resins can be 1,1,3,3-tetramethyldisiloxane-1,3-bis2-(3,4-epoxycyclohexyl)ethyl, 1,1,3,3-tetramethyldisiloxane-1,3-bisglycidoxypropyl, Bis(3,4-epoxycyclohexylmethyl) adipate, 3,4-Epoxycyclohexylmethyl 3,4-epoxycyclohexanecarboxylate, 1,4-Cyclohexanedimethanol diglycidyl ether, Bisphenol A diglycidyl ether, Diglycidyl 1,2-cyclohexanedicarboxylate, to mention a few.

The curing agent added to the final formulation is any compound that can initiate and/or accelerate the curing process of functional groups in siloxane polymer. These curing agents can be either heat and/or UV activated. The cross-linking groups in the siloxane polymer, as mentioned above, are preferably epoxide, oxetane, acrylate, alkenyl or alkynyl groups. The curing agent is selected based on the cross-linking group in the siloxane polymer.

In one embodiment, the curing agent for epoxy and oxetane groups can be selected from nitrogen-containing curing agents, such as primary and/or secondary amines which show blocked or decreased activity. The definition "primary or secondary amines which show blocked or decreased reactivity" shall mean those amines which due to a chemical or physical blocking are incapable or only have very low capability to react with the resin components, but may regenerate their reactivity after liberation of the amine, e.g. by melting it at increased temperature, by removing sheath or coatings, by the action of pressure or of supersonic waves or of other energy types, the curing reaction of the resin components starts.

Examples of heat-activatable curing agent include complexes of at least one organoborane or borane with at least one amine. The amine may be of any type that complexes the organoborane and/or borane and that can be decomplexed to free the organoborane or borane when desired. The amine may comprise a variety of structures, for example, any primary or secondary amine or polyamines containing primary and/or secondary amines. The organoborane can be selected from alkyl boranes. An example of these heat particular preferred borane is boron trifuoride. Suitable amine/(organo)borane complexes are available from commercial sources such as King Industries, Air products, and ATO-Tech.

Other heat activated curing agents for epoxy groups are thermal acid generators which can release strong acids at elevated temperature to catalyze cross-linking reactions of epoxy. These thermal acid generators can be for example any onium salts like sulfonium and iodonium salts having complex anion of the type BF4-, PF6-, SbF6-, CF3SO3-, and (C6F5)4B-. Commercial examples of these thermal acid generators are K-PURE CXC-1612 and K-PURE CXC-1614 manufactured by King Industries.

Additionally, with respect to epoxy and/or oxetane containing polymers, curing agent, co-curing agents, catalysts, initiators or other additives designed to participate in or promote curing of the adhesive formulation like for example, anhydrides, amines, imidazoles, thiols, carboxylic acids, phenols, dicyandiamide, urea, hydrazine, hydrazide, amino-formaldehyde resins, melamine-formaldehyde resins, quaternary ammonium salts, quaternary phosphonium salts, tri-aryl sulfonium salts, di-aryl iodonium salts, diazonium salts, and the like, can be used.

For acrylate, alkenyl and alkynyl cross linking groups curing agent can be either thermal or UV activated. Examples of thermal activated are peroxides and azo compounds. Peroxide is a compound containing unstable oxygen-oxygen single bond which easily split into reactive radicals via hemolytic cleavage. Azo compounds have R—N=N—R functional group which can decompose to nitrogen gas and two organic radicals. In both of these cases, the radicals can catalyze the polymerization of acrylate, alkenyl and alkynyl bonds. Examples of peroxide and azo compounds are di-tert-butyl peroxide, 2,2-Bis(tert-butylperoxy)butane, tert-Butyl peracetate, 2,5-Di(tert-butylperoxy)-2,5-dimethyl-3-hexyne, Dicumyl peroxide, Benzoyl peroxide, Di-tert-amyl peroxide, tert-Butyl peroxybenzoate, 4,4'-Azobis(4-cyanopentanoic acid), 2,2'-Azobis(2-amidinopropane) dihydrochloride, diphenyldiazene, Diethyl azodicarboxylate and 1,1'-Azobis(cyclohexane-carbonitrile), to mention a few Photoinitiators are compounds that decompose to free radicals when exposed to light and therefore can promote polymerization of acrylate, alkenyl and alkynyl compounds. Commercial examples of these photoinitiators are Irgacure 149, Irgacure 184, Irgacure 369, Irgacure 500, Irgacure 651, Irgacure 784, Irgacure 819, Irgacure 907, Irgacure 1700, Irgacure 1800, Irgacure 1850, Irgacure 2959, Irgacure 1173, Irgacure 4265 manufactured by BASF.

One method to incorporate curing agent to the system is to attach a curing agent or a functional group that can act as curing agent, to a silane monomer. Therefore the curing agent will accelerate curing of the siloxane polymer. Examples of these kind of curing agents attached to a silane monomer are to γ-Imidazolylpropyltriethoxysilane, γ-Imidazolylpropyltrimethoxysilanel, 3-mercaptopropyltrimethoxysilane, 3-mercaptopropyltriethoxysilane, 3-(triethoxysilyl)-propylsuccinicanhydride, 3-(trimethoxysilyl) propylsuccinicanhydride, 3-aminopropyl-trimethoxysilane and 3-aminopropyltriethoxysilane to mention a few.

An adhesion promoter can be part of the composition and can be any suitable compound that can enhance adhesion between cured product and surface where product has been applied. Most commonly used adhesion promoters are functional silanes where alkoxysilanes and one to three functional groups. Examples of adhesion promoter used in die attach products can be octyltriethoxysilane, mercaptopropyltriethoxysilane, cyanopropyltrimethoxysilane, 2-(3,4-Epoxycyclohexyl)ethyltrimethoxysilane, 2-(3,4-epoxycyclohexyl)ethyltriethoxysilane, 3-(Trimethoxysilyl) propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane and 3-acryloxypropyltrimethoxysilane.

The polymerized siloxane formed will have a [Si—O—Si—O], repeating backbone (i.e. a backbone of repeating units of formula [Si—O—Si—O]), with organic functional groups thereon depending on the silicon containing starting materials. However it is also possible to achieve a [Si—O—Si—C], or even a [Si—O—Me—O], (where Me is a metal) backbone. In the formulas, n is an integer of typically 1 to 1,000,000, in particular 1 to 100,000, for example 1 to 10,000, or even 1 to 5,000 or 1 to 1,000.

To obtain a [Si—O—Si—C] backbone, a chemical with formula $R^23$–a $R^1aSiR^{11}SiR^1bR^23$–b can be polymerized together with the first, second, and third compounds or any combination of these, as mentioned above, where a is from 1 to 3, b is from 1 to 3, $R^1$ is a reactive group like explained above, $R^2$ is an alkyl, alkenyl, alkynyl, alcohol, carboxylic acid, dicarboxylic acid, aryl, polyaryl, polycyclic alkyl, hetero cyclic aliphatic, hetero cyclic aromatic group and $R^{11}$ is independently an alkyl group or aryl group, or an oligomer thereof having a molecular weight of less than 1000 g/mol. Examples of these compound are 1,2-bis(dimethylhydroxylsilyl)ethane, 1,2-bis(trimethoxylsilyl)ethane, 1,2-Bis(dimethoxymethylsilyl)ethane, 1,2-Bis(methoxydimethylsilyl) ethane, 1,2-bis(triethoxylsilyl)ethane, 1,3-bis (dimethylhydroxylsilyl)propane, 1,3-bis(trimethoxylsilyl) propane, 1,3-Bis(dimethoxymethylsilyl)propane, 1,3-Bis (methoxydimethylsilyl)propane, 1,3-bis(triethoxylsilyl) propane, 1,4-bis(dimethylhydroxylsilyl)butane, 1,4-bis (trimethoxylsilyl)butane, 1,4-Bis(dimethoxymethylsilyl)

butane, 1,4-Bis(methoxydimethylsilyl)butane, 1,4-bis(triethoxylsilyl)butane, 1,5-bis(dimethylhydroxylsilyl)pentane, 1,5-bis(trimethoxylsilyl)pentane, 1,5-Bis(dimethoxymethylsilyl)pentane, 1,5-bis(methoxydimethylsilyl)pentane, 1,5-bis(triethoxylsilyl)pentane, 1,6-bis(dimethylhydroxylsilyl)hexane, 1,6-bis(trimethoxylsilyl)hexane, 1,6-Bis(dimethoxymethylsilyl)hexane, 1,6-Bis(methoxydimethylsilyl)hexane, 1,6-bis(triethoxylsilyl)hexane 1,4-bis(trimethoxylsilyl)benzene, bis(trimethoxylsilyl)naphthalene, bis(trimethoxylsilyl)anthrazene, bis(trimethoxylsilyl)phenanthere, bis(trimethoxylsilyl)norbornene, 1,4-Bis(dimethylhydroxysilyl)benzene, 1,4-bis(methoxydimethylsilyl)benzene and 1,4-bis(triethoxysilyl)benzene to mention few.

In one embodiment to obtain [Si—O—Si—C] backbone, a compound with formula $R^5{}_{3-(c+d)}R^4dR^3cSiR^{11}SiR^3eR^4fR^5{}_{3-(e+f)}$ is polymerized together with the first, second, third compounds as mentioned herein, or any combinations of these, where $R^3$ is a cross-linking functional group, $R^4$ is a reactive group, and $R^5$ is an alkyl, alkenyl, alkynyl, alcohol, carboxylic acid, dicarboxylic acid, aryl, polyaryl, polycyclic alkyl, hetero cyclic aliphatic, hetero cyclic aromatic group, $R^{12}$ is independently an alkyl group or aryl group, and where c=1 to 2, d=1 to (3−c), e=1 to 2, and f=1 to (3−e),or an oligomer thereof having a molecular weight of less than 1000 g/mol. Examples of these compounds are 1,2-bis(ethenyldimethoxysilyl)ethane, 1,2-bis(ethynyldimethoxysilyl)ethane, 1,2-bis(ethynyldimethoxy)ethane, 1,2-bis(3-glycidoxypropyldimethoxysilyl)ethane, 1,2-bis[2-(3,4-Epoxycyclohexyl)ethyldimethoxysilyl]ethane, 1,2-bis(propylmethacrylatedimethoxysilyl)ethane, 1,4-bis(ethenyldimethoxysilyl)benzene, 1,4-bis(ethynyldimethoxysilyl)benzene, 1,4-bis(ethynyldimethoxysilyl)benzene, 1,4-bis(3-glycidoxypropyldimethoxysilyl)benzene, 1,4-bis[2-(3,4-epoxycyclohexyl)ethyldimethoxysilyl]benzene, 1,4-bis(propylmethacrylatedimethoxysilyl)-benzene, to mention few.

In one embodiment a siloxane monomer with molecular formula $R^1aR^2bR^3{}_{3-(a+b)}Si$—O—$SiR^2{}_2$—O—Si $R^1aR^2bR^3{}_{3-(a+b)}$ where $R^1$ is reactive group like explained above, $R^2$ is alkyl or aryl like explained above, $R^3$ is cross linking functional group like explained above and a=0 to 3, b=0 to 3, is polymerized with previously mentioned silanes or added as an additive to the final formulation. Examples of these compounds are 1,1,5,5-tetramethoxy-1,5-dimethyl-3,3-diphenyltrisiloxane, 1,1,5,5-tetramethoxy-1,3,3,5-tetraphenyltrisiloxane, 1,1,5,5-tetraethoxy-3,3-diphenyltrisiloxane, 1,1,5,5-tetramethoxy-1,5-divinyl-3,3-diphenyltrisiloxane, 1,1,5,5-tetramethoxy-1,5-dimethyl-3,3-diisopropyltrisiloxane, 1,1,1,5,5,5-hexamethoxy-3,3-diphenyltrisiloxane, 1,5-dimethyl-1,5-diethoxy-3,3-diphenyltrisiloxane, 1,5-bis(mercaptopropyl)-1,1,5,5-tetramethoxy-3,3-diphenyltrisiloxane, 1,5-divinyl-1,1,5,5-tetramethoxy-3-phenyl-3-methyltrisiloxane, 1,5-divinyl-1,1,5,5-tetramethoxy-3-cyclohexyl-3-methyltrisiloxane, 1,1,7,7-tetramethoxy-1,7-divinyl-3,3,5,5-tetramethyltetrasiloxane, 1,1,5,5-tetramethoxy-3,3-dimethyltrisiloxane, 1,1,7,7-tetraethoxy-3,3,5,5-tetramethyltetrasiloxane, 1,1,5,5-tetraethoxy-3,3-dimethyltrisiloxane, 1,1,5,5-tetramethoxy-1,5-[2-(3,4-epoxycyclohexypethyl]-3,3-diphenyltrisiloxane, 1,1,5,5-tetramethoxy-1,5-(3-glycidoxypropyl)-3,3-diphenyltrisiloxane, 1,5-dimethyl-1,5-dimethoxy-1,5-[2-(3,4-epoxycyclohexypethyl]-3,3-diphenyltrisiloxane, 1,5-dimethyl-1,5-dimethoxy-1,5-(3-glycidoxypropyl)-3,3-diphenyltrisiloxane to mention few examples.

An additive added to the composition (after polymerization of the siloxane material as noted above) can be a silane compound with formula of $R^1aR^2bSiR^3{}_{4-(a+b)}$ where $R^1$ is reactive group like hydroxyl, alkoxy or acetyloxy, $R^2$ is alkyl or aryl group, $R^3$ is crosslinking compound like epoxy, oxetane, alkenyl, acrylate or alkynyl group, a=0 to 1 and b=0 to 1. Examples of such additives are tri-(3-glycidoxypropyl)phenylsilane, tri-[2-(3,4-epoxycyclohexyl)ethyl]phenylsilane, tri-(3-methacryloxypropyl)phenylsilane, tri-(3-acryloxypropyl)phenylsilane, tetra-(3-glycidoxypropyl)silane, tetra-[2-(3,4-epoxycyclohexyl)ethyl]silane, tetra-(3-methacryloxypropyl)silane, tetra-(3-acryloxypropyl)silane, tri-(3-glycidoxypropyl)p-tolylsilane, tri-[2-(3,4-epoxycyclohexyl)ethyl]p-tolylsilane, tri-(3-methacryloxypropyl)p-tolylsilane, tri-(3-acryloxypropyl)p-tolylsilane, tri-(3-glycidoxypropyl)hydroxylsilane, tri-[2-(3,4-epoxycyclohexyl)ethyl]hydroxylsilane, tri-(3-methacryloxypropyl)hydroxylsilane, tri-(3-acryloxypropyl)hydroxylsilane.

The additives can be also any organic or silicone polymers that may react or may not react with the main polymer matrix therefore acting as plasticizer, softener, or matrix modifier like silicone. The additive can be also an inorganic polycondensate such as SiOx, TiOx, AlOx, TaOx, HfOx, ZrOx, SnOx, polysilazane.

For a retardation layer, patterned or not, the particles added to the siloxane composition can be particles that are any suitable metal or semi-metal particles such as those selected from gold, silver, copper, platinum, palladium, indium, iron, nickel, aluminum, carbon, cobalt, strontium, zinc, molybdenum, titanium, tungsten, silver plated copper, silver plated aluminum, bismuth, tin, bismuth-tin alloy, silver plated fiber or alloys or combinations of these. Metal particles that are transition metal particles (whether early transition metals or late transition metals) are envisioned, as are semi metals and metalloids. Semi-metal or metalloid particles such as arsenic, antimony, tellurium, germanium, silicon, and bismuth are envisioned. Most preferred are noble metal particles, such as gold, silver, platinum or palladium. Other noble metals such as ruthenium, rhodium, osmium or iridium are also possible.

Also possible are particles that comprise carbon and are selected from carbon black, graphite, graphene, diamond, silicon carbonitride, titanium carbonitride, carbon nanobuds and carbon nanotubes. The particles of the filler can be carbide particles, such as iron carbide, silicon carbide, cobalt carbide, tungsten carbide, boron carbide, zirconium carbide, chromium carbide, titanium carbide, or molybdenum carbide.

Alternatively the particles can be formed from an electrically nonconductive material, such as silica, quartz, alumina, aluminum nitride, aluminum nitride coated with silica, barium sulfate, alumina trihydrate, boron nitride, etc. The fillers can be the form of particles or flakes, and can be micro-sized or nano-sized. The filler may comprise ceramic compound particles that are nitrides, oxynitrides, carbides, and oxycarbides of metals or semimetals are possible. In particular, the filler can be particles that are ceramic particles that are an oxide of silicon, zinc, aluminum, yttrium, ytterbium, tungsten, titanium silicon, titanium, antimony, samarium, nickel, nickel cobalt, molybdenum, magnesium, manganese, lanthanide, iron, indium tin, copper, cobalt aluminum, chromium, cesium or calcium. The particles could instead be nitride particles, such as aluminum nitride, tantalum nitride, boron nitride, titanium nitride, copper nitride, molybdenum nitride, tungsten nitride, iron nitride, silicon nitride, indium nitride, gallium nitride or carbon nitride.

The particle filler can formed of a conductive material (such as for an electrically conductive or other layer within the same device) such as carbon black, graphite, graphene, gold, silver, copper, platinum, palladium, nickel, aluminum, silver plated copper, silver plated aluminum, bismuth, tin, bismuth-tin alloy, silver plated fiber, nickel plate copper, silver and nickel plated copper, gold plated copper, gold and nickel plated copper, or it may be gold, silver-gold, silver, nickel, tin, platinum, titanium plated polymer such as polyacrylate, polystyrene or silicone but not limited to these. The filler can be also a semiconductor material such as silicon, n or p type doped silicon, GaN, InGaN, GaAs, InP, SiC but not limited to these. Furthermore, the filler can be quantum dot or a surface plasmonic particle or phosphor particle. Other semiconductor particles or quantum dots, such as Ge, GaP, InAs, CdSe, ZnO, ZnSe, TiO2, ZnS, CdS, CdTe, etc. are also possible.

Particles of any suitable size can be used, depending upon the final application. In many cases small particles having an average particle size of less than 100 microns, and preferably less than 50 or even 20 microns are used. However, for obtaining higher optical transmissivity, sub-micron particles, such as those less than 1 micron, or e.g. from 1 to 500 nm, such as less than 200 nm, such as from 1 to 100 nm, or even less than 10 nm, are also envisioned. In other examples, particles are provided that have an average particle size of from 5 to 50 nm, or from 15 to 75 nm, under 100 nm, or from 50 to 500 nm. Desirable are nanoparticles having an average particle size of less than 50 nm, e.g. less than 25 nm. In general for improved optical transmissivity, it can be desirable to provide particles with an average particle size less than the wavelength of electromagnetic radiation passing therethrough. For visible light devices (displays, lamps etc) with visible light being within 400 to 700 nm, it is preferably that the particles have an average particle size of less than 700 nm and more preferably less than 400 nm.

Particles that are not elongated, e.g. substantial spherical or square, or flakes with a flattened disc shaped appearance (with smooth edges or rough edges) are possible, however preferred are elongated whiskers, cylinders, wires and other elongated particles, such as those having an aspect ratio of 2:1 or more, e.g. 5:1 or more, or 10:1 or more. Very elongated particles, such as nanowires and nanotubes having a very high aspect ratio are also possible, though for optical transmissivity purposes, a maximum average dimension of less than 400 nm is preferred. High aspect ratios for nanowires or nanotubes can be at 25:1 or more, 50:1 or more, or even 100:1 or more. The average particle size for nanowires or nanotubes is in reference to the smallest dimension (width or diameter) as the length can be quite long, even up to centimeters long. As used herein, the term "average particle size" refers to the $D_{50}$ value of the cumulative volume distribution curve at which 50% by volume of the particles have a diameter less than that value. Preferred however are nanorods having a width of from 5-50 nm and length of 10-200 nm, and e.g. with a length to width ratio of from 2:1 to 25:1.

To enhance the coupling with filler and siloxane polymer, a coupling agent can be used. This coupling agent will increase the adhesion between filler and polymer and therefore can increase thermal and/or electrical conductivity of the final product. The coupling agent can be any silane monomer with a formula of $R^{13}hR^{14}iSiR^{15}j$ where $R^{13}$ is a reactive group like halogen, hydroxyl, alkoxy, acetyl or acetyloxy, $R^{14}$ is alkyl or aryl group and $R^{15}$ is a functional group including like epoxy, anhydride, cyano, oxetane, amine, thiol, allyl, alkenyl or alkynyl, $h=0$ to 4, $I=0$ to 4, $j=0$ to 4 and $h+i+j=4$. The coupling agent can be either mixed directly with filler, siloxane polymer, curing agent, and additives when final product is prepared or the filler particles can be treated by the coupling agent before they are mixed with particles.

The particles can be provided to the siloxane material with or without surface treatment. If surface treated first, the surface can be coated with an organic material such as carboxylic acid, PVP or PVA, and could be an amine, thiol, silane or combination thereof.

If the particles are treated with a coupling agent before using them in the final formulation, different methods like deposition from alcohol solution, deposition from aqueous solution, bulk deposition onto filler and anhydrous liquid phase deposition can be used. In the deposition from alcohol solution, alcohol/water solution is prepared and the solution pH is adjusted to slightly acidic (pH 4.5-5.5). Silane is added to this solution and mixed for few minutes to allow partly hydrolyzing. Then filler particles are added and the solution is mixed from to RT to refluxing temperature for different time periods. After mixing, the particles are filtered, rinsed with ethanol and dried in an oven to obtain surface treated particles by the coupling agent. Deposition from aqueous solution is similar compared to deposition from alcohol solution but instead of alcohol, pure water is used as a solvent. pH is again adjusted by acid if non amine functionalized is used. After mixing particles with water/silane mixture, the particles are filtered, rinsed and dried.

Bulk deposition method is a method where silane coupling agent is mixed with solvent without any water or pH adjustment. The filler particles are coated with the silane alcohol solution using different methods like spray coating and then dried in an oven.

In the anhydrous liquid phase deposition, silane are mixed with organic solvent like toluene, tetrahydrofuran or hydrocarbon and filler particles are refluxed in this solution and the extra solvent is removed by vacuum or filtering. The particles can be also dried afterwards in an oven but it is not sometimes need due to direct reaction between particles and filler under refluxing conditions.

Examples of such silane coupling agents are bis (2-hydroxyethyl)-3-aminopropyltriethoxysilane, Allyltrimethoxysilane, N-(2-Aminoethyl)-3-aminopropylmethyldimethoxysilane, N-(2-Aminoethyl)-3-aminopropyltrimethoxysilane, 3-Aminopropylmethyldiethoxysilane. 3-Aminopropyltriethoxysilane, 3-Aminopropyltrimethoxysilane, (N-Trimethoxysilylpropyl)polyethyleneimine, Trimethoxysilylpropyldiethylenetriamine, Phenyltriethoxysilane, Phenyltrimethoxysilane, 3-Chloropropyltrimethoxysilane, 1-Trimethoxysilyl-2(p,m-chloromethyl)phenylethane, 2-(3, 4-Epoxycyclohexyl)ethyltrimethoxysilane, 3-Glycidoxypropyltrimethoxysilane, Isocyanatepropyltriethoxysilane, Bis[3-(triethoxysilyl)propyl]tetrasulfide, 3-Mercaptopropylmethyldimethoxysilane, 3-Mercaptopropyltrimethoxysilane, 3-Methacryloxypropyltrimethoxysilane, 2-(Diphenylphosphino)ethyltriethoxysilane, 1,3-Divinyltetramethyldisilazane, Hexamethyldisilazane, 3-(N-Styrylmethyl-2-aminoethylamino)propyltrimethoxysilane, N-(Triethoxysilylpropyl)urea, 1,3-Divinyltetramethyldisilazane, Vinyltriethoxysilane and Vinyltrimethoxysilane to mention a few.

Depending on the type of particles added, the siloxane-particle cured final product can be a layer or film that is thermally conductive, such as having a thermal conductivity, after final heat or UV curing, of greater than 0.5 watts per meter kelvin (W/(m·K)). Higher thermal conductivity materials are possible, depending upon the type of particles selected. Metal particles in the siloxane composition can result in a cured final film having a thermal conductivity greater than 2.0 W/(m·K), such as greater than 4.0 W/(m·K), or even greater than 10.0 W/(m·K). However in other applications, particles may be selected to result, if desired, in a material having low thermal conductivity.

For a retardation layer having a high resistivity, the final cured product can have high electrical resistivity, such as greater than 1×103 Ω/square, preferably greater than 1×103 Ω/square, such as greater than 1×105 Ω/square, or even higher at e.g. greater than 1×105 Ω/square.

In some cases, in LED or LCD devices such as displays or where the insulating siloxane composition will be applied in a device that requires optical characteristics, though it may be desirable in some cases for the final cured siloxane to have optically absorbing or optically reflecting properties, it is more likely that the material would desirably be highly transmissive to light in the visible spectrum (or in the spectrum in which the final device is operated). As an example of a transparent material, the final cured layer having a thickness of from 1 to 50 microns will transmit at least 85% of the visible light incident perpendicularly thereto, or preferably transmit at least 90%., more preferably at least 92.5% and most preferably at least 95% As an example of a reflective layer, the final cured layer can reflect at least 85% of the light incident thereon, preferably reflect at least 95% of the light incident thereon at an angle of 90 degrees.

The material of the present invention may also contain a stabilizer and/or an antioxidant. These compounds are added to protect the material from degradation caused by reaction with oxygen induced by such things as heat, light, or residual catalyst from the raw materials.

Among the applicable stabilizers or antioxidants included herein are high molecular weight hindered phenols and multifunctional phenols such as sulfur and phosphorous-containing phenol. Hindered phenols are well known to those skilled in the art and may be characterized as phenolic compounds which also contain sterically bulky radicals in close proximity to the phenolic hydroxyl group thereof. In particular, tertiary butyl groups generally are substituted onto the benzene ring in at least one of the ortho positions relative to the phenolic hydroxyl group. The presence of these sterically bulky substituted radicals in the vicinity of the hydroxyl group serves to retard its stretching frequency, and correspondingly, its reactivity; this hindrance thus providing the phenolic compound with its stabilizing properties. Representative hindered phenols include; 1,3,5-trimethyl-2,4,6-tris-(3,5-di-tert-butyl-4-hydroxybenzyl)-benzene; pentaerythrityl tetrakis-3(3,5-di-tert-butyl-4-hydroxyphenyl)-propionate; n-octadecyl-3(3,5-di-tert-butyl-4-hydroxyphenyl)-propionate; 4,4'-methylenebis(2,6-tert-butyl-phenol); 4,4'-thiobis(6-tert-butyl-o-cresol); 2,6-di-tertbutylphenol; 6-(4-hydroxyphenoxy)-2,4-bis(n-octylthio)-1,3,5 triazine; di-n-octylthio)ethyl 3,5-di-tert-butyl-4-hydroxy-benzoate; and sorbitol hexa[3-(3,5-di-tert-butyl-4-hydroxy-phenyl)-propionate]. Commercial examples of antioxidant are for example Irganox 1035, Irganox 1010, Irganox 1076, Irganox 1098, Irganox 3114, Irganox PS800, Irganox PS802, Irgafos 168 manufactured by BASF.

The weight ratio between siloxane polymer and filler is between 100:0 to 5:95 depending of the final use of the product. The ratio between siloxane polymer and crosslinking silicon or non-silicon based resin or oligomer is between 100:0 to 75:25. The amount of curing agent calculated from siloxane polymer amount is from 0.1 to 20%. The amount of adhesion promoter based on total amount of formulation is from 0 to 10%. The amount of antioxidant based on total weight of the formulation is from 0 to 5%.

Depending upon the type of curing mechanism and catalyst activation the final formulation is cured usually by heating the material to higher temperature. For example if thermal acid generator is used, the material is placed in oven for specific time period. Also possible is curing with electromagnetic radiation, such as UV light.

The molecular weight of the siloxane polymer formed from polymerization of the first and second compounds is from about 300 to 10,000 g/mol, preferably from about 400 to 5000 g/mol, and more preferably from about 500 to 2000 g/mol. The polymer is combined with particles of any desired size, preferably having an average particle size of less than 100 microns, more preferably less than 50 microns, or even less than 20 microns. The siloxane polymer is added at a weight percent of from 10 to 90%, and the particles are added at a weight percent of from 1 to 90%. If the final use of the siloxane material requires optical transparency, the particles may be ceramic particles added at a lower weight percent, such as from 1 to 20% by weight. However, if the particles have an average particle size less than the wavelength of visible light, e.g. preferably less than 400 nm (e.g. less than 200 nm, or even smaller such as less than 100 nm or less than 50 nm average particle size) higher weight percent loadings are possible, such as from 20 to 50%, or greater than 50%, greater than 75%, or even greater than 90%, while still achieving the desired optical transparency (e.g. even at a loading of 75% the optical transmissivity can be greater than 90% or even greater than 95% for visible light).

Polymerization of the first and second compounds is performed, and the particles mixed therewith, to form a viscous fluid having a viscosity of from 50 to 100000 mPa-sec, preferably from 1000 to 75000 mPa-sec, and more preferably from 5000 to 50000 mPa-sec. The viscosity can be measured with a viscometer, such as a Brookfield or Cole-Parmer viscometer, which rotates a disc or cylinder in a fluid sample and measures the torque needed to overcome the viscous resistance to the induced movement. The rotation can be at any desired rate, such as from 1 to 30 rpm, preferably at 5 rpm, and preferably with the material being measured being at 25° C.

After polymerization, any additional desired components can be added to the composition, such as particles, coupling agents, curing agents, etc. The composition is shipped to customers as a viscous material in a container, which may be shipped at ambient temperature without the need for cooling or freezing. As a final product, the material can be applied in the variety of uses mentioned above, typically being heat or UV cured to form a solid cured polymeric siloxane layer.

The composition as disclosed herein is preferably without any substantial solvent. A solvent may be temporarily added, such as to mix a curing agent or other additive with the polymerized viscous material. In such a case, the e.g. curing agent is mixed with a solvent to form a fluid material that can then be mixed with the viscous siloxane polymer. However, as a substantially solvent free composition can sometimes be desirable for shipping to customers, and later application on a customer's device, the solvent that has been temporarily added is removed in a drying chamber. There may however be trace amounts of solvent remaining that were not able to be removed during the drying process, though the composition is substantially free of solvent. This solvent removal aids in the deposition of the composition disclosed herein, by reducing shrinkage during the final curing process, as well as minimizing shrinkage over time during the lifetime of the device, as well as aiding thermal stability of the material during the lifetime of the device. However, as mentioned hereinabove, though no solvent is necessary for the application of the siloxane composition, if very thin layers are desired, it may be desirable to add an organic solvent, non polar or polar (protic or aprotic), so as to provide the siloxane material as a low viscosity liquid in order to minimize the deposited layer's thickness.

Knowing the final application of the composition, the desired viscosity of the composition, and the particles to be included, it is possible to fine tune the siloxane polymer (starting compounds, molecular weight, viscosity, etc.) such that, upon incorporation into the composition having particles and other components, the desired final properties are achieved for subsequent delivery to the customer. Due to the stability of the composition, it is possible to ship the composition at ambient temperature without any substantial change in molecular weight or viscosity, even after a one week, or even one month, time period from making till final use by the customer.

EXAMPLES

The following siloxane polymer examples are given by way of illustration and are not intended to be limitative The viscosity of siloxane polymer was measured by Brookfield viscometer (spindle 14). The molecular weight of the polymer was measured by Agilent GPC.

Siloxane polymer i: A 500 mL round bottom flask with stirring bar and reflux condenser was charged with diphenylsilanediol (60 g, 45 mol %), 2-(3,4-Epoxycyclohexyl) ethyl]trimethoxysilane (55.67 g, 36.7 mol %) and tetramethoxysilane (17.20 g, 18.3 mol %). The flask was heated to 80° C. under nitrogen atmosphere and 0.08 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1000 mPas and Mw of 1100.

Siloxane polymer ii: A 250 mL round bottom flask with stirring bar and reflux condenser was charged with diphenylsilanediol (30 g, 45 mol %), 2-(3,4-Epoxycyclohexyl) ethyl]trimethoxysilane (28.1 g, 37 mol %) and dimethyldimethoxysilane (6.67 g, 18 mol %). The flask was heated to 80° C. under nitrogen atmosphere and 0.035 g of barium hydroxide monohydrate dissolved in 1 mL of methanol was added dropwise to the mixture of silanes. The silane mixture was stirred at 80 C for 30 min during the diphenylsilanediol reacted with alkoxysilanes. After 30 min, formed methanol was evaporated under vacuum. The siloxane polymer had viscosity of 2750 mPas and Mw of 896.

Siloxane polymer iii: A 250 mL round bottom flask with stirring bar and reflux condenser was charged with diphenylsilanediol (24.5 g, 50 mol %), 2-(3,4-Epoxycyclohexyl) ethyl]trimethoxysilane (18.64 g, 33.4 mol %) and tetramethoxysilane (5.75 g, 16.7 mol %). The flask was heated to 80° C. under nitrogen atmosphere and 0.026 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 7313 mPas and Mw of 1328.

Siloxane polymer iv: A 250 mL round bottom flask with stirring bar and reflux condenser was charged with diphenylsilanediol (15 g, 50 mol %), 2-(3,4-Epoxycyclohexyl) ethyl]trimethoxysilane (13.29 g, 38.9 mol %) and bis(trimethoxysilyl)ethane (4.17 g, 11.1 mol %). The flask was heated to 80° C. under nitrogen atmosphere and 0.0175 g of barium hydroxide monohydrate dissolved in 1 mL of methanol was added dropwise to the mixture of silanes. The silane mixture was stirred at 80 C for 30 min during the diphenylsilanediol reacted with alkoxysilanes. After 30 min, formed methanol was evaporated under vacuum. The siloxane polymer had viscosity of 1788 mPas and Mw of 1590.

Siloxane polymer v: A 250 mL round bottom flask with stirring bar and reflux condenser was charged with diphenylsilanediol (15 g, 45 mol %), 2-(3,4-Epoxycyclohexyl) ethyl]trimethoxysilane (13.29 g, 35 mol %) and vinyltrimethoxysilane (4.57 g, 20 mol %). The flask was heated to 80° C. under nitrogen atmosphere and 0.018 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1087 mPas and Mw of 1004.

Siloxane polymer vi: A 250 mL round bottom flask with stirring bar and reflux condenser was charged with di-isopropylsilanediol (20.05 g, 55.55 mol %), 2-(3,4-Epoxycyclohexyl)ethyl]trimethoxysilane (20.0 g, 33.33 mol %) and bis(trimethoxysilyl)ethane (7.3 g, 11.11 mol %). The flask was heated to 80° C. under nitrogen atmosphere and 0.025 g of barium hydroxide monohydrate dissolved in 1 mL of methanol was added dropwise to the mixture of silanes. The silane mixture was stirred at 80 C for 30 min during the diphenylsilanediol reacted with alkoxysilanes. After 30 min, formed methanol was evaporated off under vacuum. The siloxane polymer had viscosity of 150 mPas and Mw of 781.

Siloxane polymer vii: A 250 mL round bottom flask with stirring bar and reflux condenser was charged with di-isobutylsilanediol (18.6 g, 60 mol %) and 2-(3,4-Epoxycyclohexyl)ethyl]trimethoxysilane (17.32 g, 40 mol %). The flask was heated to 80° C. under nitrogen atmosphere and 0.019 g of barium hydroxide monohydrate dissolved in 1 mL of methanol was added dropwise to the mixture of silanes. The silane mixture was stirred at 80 C for 30 min while the diphenylsilanediol reacted with alkoxysilanes. After 30 min, formed methanol was evaporated off under vacuum. The siloxane polymer had viscosity of 75 mPas and Mw of 710.

Composition Examples

The following composition examples are given by way of illustration and are not intended to be limitative.

Comp. example 1, Silver filled adhesive: A siloxane polymer with epoxy as a crosslinking functional group (18.3 g, 18.3%), silver flake with average size (D50) of 4 micrometer (81 g, 81%), 3-methacrylatepropyltrimethoxysilane (0.5 g, 0.5%) and King Industries K-PURE CXC-1612 thermal acid generator (0.2%) where mixed together using high shear mixer. The composition has a viscosity of 15000 mPas.

Comp. example 2, Alumina filled adhesive: A siloxane polymer with epoxy as a crosslinking functional group (44.55, 44.45%), aluminium oxide with average size (D50) of 0.9 micrometer (53g, 53%), 3-methacrylatepropyltrimethoxysilane (1 g, 1%), Irganox 1173 (1 g, 1%) and King Industries K-PURE CXC-1612 thermal acid generator (0.45 g, 0.45%) where mixed together using three roll mill. The composition has a viscosity of 20000 mPas.

Comp. example 3, BN filled adhesive: A siloxane polymer with epoxy as a crosslinking functional group (60 g, 60%), boron nitride platelet with average size (D50) of 15 micrometer (35 g, 35%), Irganox 1173 (1.3 g, 1.3%), 2-(3,4-Epoxycyclohexyl)ethyltrimethoxysilane (3.4 g, 3.4%) and King Industries K-PURE CXC-1612 thermal acid generator (0,3g, 0.3%) where mixed together using three roll mill. The composition has a viscosity of 25000 mPas.

Comp. example 4, Translucent material: A siloxane polymer with methacrylate as a functional group (89 g, 89%), fumed silica with average size (D50) of 0.007 micrometer (5 g, 5%), Irganox 1173 (2 g, 2%) and Irgacure 917 photoinitiator (4 g, 4%) where mixed together using three roll mill. The composition has a viscosity of 25000 mPas.

Comp. example 5, transparent material: Diphenylsilanediol (20.0 g, 92 mmol), 9-phenanthrenyl trimethoxysilane (16.6 g, 56 mmol), 3-methacryloxypropyltrimethoxysilane (9.2 g, 37 mmol) and BaO (25 mg) in methanol were placed in a 100 mL flask and refluxed for 1 hour. The volatiles were evaporated under reduced pressure. Clear polymer resin (37 g) was obtained.

Comp. example 6, high refractive index material: 8.6 g polymer resin having a high index of refraction, prepared as described in Example X1, was blended with 5.7 g ZrO2 nanoparticle solution in 1,2-propanediol monomethyl ether acetate (PGMEA) having a solid content of 50%. 0.26 g photoinitiator (Darocur 1173 by BASF), 0.4 g of oligomeric 3-methacryloxypropyl-trimethoxysilane as an adhesion promoter, and 20 mg surfactant (BYK-307 by BYK Chemie) were added to the solution.

In view of the disclosed methods and materials, a stable composition is formed. The composition may have one part that is a siloxane polymer having a [—Si—O—Si—O]$_n$, repeating backbone, with alkyl or aryl groups thereon, and functional cross-linking groups thereon, and another part that is particles mixed with the siloxane material, wherein the particles have an average particle size of less than 100 microns, the particles being any suitable particles though preferably are noble metal nanorods. "n" has the same meaning as above. The composition as shipped to customers may have a molecular weight of from 300 to 10,000 g/mol, and a viscosity of from 1000 to 75000 mPa-sec at 5 rpm viscometer.

The viscous (or liquid) siloxane polymer is substantially free of —OH groups, thus providing increased shelf-life, and allowing for storing or shipping at ambient temperature if desired. Preferably, the siloxane material has no —OH peak detectable from FTIR analysis thereof. The increased stability of the formed siloxane material allows for storage prior to use where there is a minimal increase in viscosity (cross-linking) during storage, such as less than 25% over the period of 2 weeks, preferably less than 15%, and more preferably less than 10% over a 2 week period stored at room temperature. And, the storage, shipping and later application by the customer can be all performed in the absence of a solvent if desired (except for possible trace residues that remain after drying to remove the solvent), avoiding the problems of solvent capture in the layer later formed in the final product, shrinkage during polymerization, mass loss over time during device usage, etc. No substantial cross-linking occurs during shipping and storage, without the application of heat preferably greater than 100° C. or UV light. The composition as well as the finally is substantially in the absence of Si—H bonds.

When the composition is deposited and polymerized, e.g. by the application of heat or UV light, very small shrinkage or reduction in mass is observed. A siloxane particle mixture as disclosed herein is heated rapidly to 150° C., then held at 150° C. for approximately 30 minutes. In this example, the siloxane particle has a Si—O backbone with phenyl group and epoxy groups, and the particles are silver particles. The mass loss is less than 1% after heat curing for over this time period. Desirably the mass loss is typically less than 4%, and generally less than 2%—however in many cases the difference in mass of the siloxane particle composition between before and after curing is less than 1%. The curing temperature is generally at less than 175° C., though higher curing temperatures are possible. Typically the curing temperature will be at 160° C. or below, more typically at 150° C. or below. However lower curing temperatures are possible, such as at 125° C. or below.

Once the retardation layer is deposited and polymerized and hardened as desired, the siloxane particle layer or mass is thermally very stable. As an example, heating the in situ material after hardening by heat or UV polymerization up to 600° C. at a ramp rate of 10° C. increase per minute, a mass loss of less than 4.0%, preferably less than 2.0%, e.g. less than 1.0% is observed at both 200° C. and 300° C. (typically a mass loss of less than 0.5% is observed at 200° C., or a mass loss of less than 0.2% at 200° C. is observed). At 300° C., a mass loss of less than 1% is observed in the example of FIG. 10, or more particularly less than 0.6%. Similar results can be observed by simply heating the polymerized material for 1 hour at 200° C., or at 300° C. Results of less than 1% mass loss by heating the polymerized deposited material at 375° C. or more for at least 1 hour are possible. Even at temperatures of greater than 500° C., a mass loss of 5% or less is observed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

INDUSTRIAL APPLICABILITY

At least some of the above embodiments provide compositions which can be deposited as a coating or film with reverse optical dispersion in semiconductor devices and microelectronic and optoelectronic devices. Applications of the materials include non-touchscreen displays and, in particular touchscreen displays. Examples of the latter include resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc. as well as touchscreens in retail, commercial and industrial environments.

CITATION LIST

Patent Literature

US 2010003528 A1
WO 2013189027 A1
KR 20140021807 A
US 2011051064 A1
US 2010060827 A1

What is claimed is:

1. A display comprising:
an array of pixels; and
an optical coating for color compensation, widening of viewing angle and/or antireflection;
wherein the optical coating comprises elongated particles having an aspect ratio of 2:1 or more mixed with a siloxane polymer, wherein the average particle width is from 5 to 50 nm and the average particle length is from 10 to 200 nm, and
wherein the elongated particles comprise noble metal particles selected from the group consisting of gold, silver, platinum, palladium, ruthenium, rhodium, osmium, and iridium,
wherein the elongated particles are present and are provided in the optical coating at 0.5 g/m² or less, and
wherein the optical coating has an index of refraction that is different for in-plane and out-of-plane, and an optical dispersion that increases within the visible spectrum as the wavelength of light increases.

2. The display of claim 1, wherein the elongated particles are gold nanorods.

3. The display of claim 1, wherein the optical coating has reverse optical dispersion at visible wavelengths.

4. The display of claim 1, which is an OLED display.

5. The display of claim 1, having no —OH groups in the siloxane polymer.

6. The display of claim 1, which is an OLED touchscreen display.

7. The display of claim 1, wherein the siloxane polymer is the result of polymerization of a silicon containing monomer and a metal containing monomer.

8. The display of claim 1, wherein the elongated particles are provided in the optical coating at an amount from 0.1 g/m² to 0.5 g/m².

9. The display of claim 1, wherein the siloxane polymer is a polymer of a silane mixture comprising a first compound, a second compound, and a third compound;
wherein the first compound is selected from the group consisting of diphenylsilanediol, dimethylsilanediol, di-isopropylsilanediol, di-n-propylsilanediol, di-n-butylsilanediol, di-t-butylsilanediol, di-isobutylsilanediol, phenylmethylsilanediol and dicyclohexylsilanediol;
wherein the second compound is selected from the group consisting of 2-(3,4-epoxycyclohexyl)ethyltrimethoxysilane, 2-(3,4-epoxycyclohexyl)ethyltriethoxysilane, 3-(trimethoxysilyl)propylmethacrylate, 3-(trimethoxysilyl)propylacrylate, (3-glycidyloxypropyl)trimethoxysilane, 3-glycidoxypropyltriethoxysilane, 3-methacryloxypropyltrimethoxysilane, 3-acryloxypropyltrimethoxysilane, 3-(3-ethyl-3-oxetanylmethoxy)propyltriethoxysilane, 3-(3-methyl-3-oxetanylmethoxy)-propyltriethoxysilane, 3-(3-ethyl-3-oxetanylmethoxy)propyltrimethoxysilane and 3-(3-methyl-3-oxetanylmethoxy)propyltrimethoxysilane;
wherein the third compound is selected from the group consisting of tetramethoxysilane, phenylmethyldimethoxysilane, trimethylmethoxysilane, dimethyldimethoxysilane, allyltrimethoxysilane, methyltrimethoxysilane, methyltriethoxysilane, methyl tripropoxysilane, propylethyltrimethoxysilane, ethyltriethoxysilane, vinyltrimethoxysilane, and vinyltriethoxysilane.

10. The display of claim 1, wherein the optical coating is thermally stable and if heated at a ramp rate of 10° C. increase per minute to 200° C. would have a mass loss of less than 2%.

11. The display of claim 1, wherein the optical coating has a birefringence of less than 0.001.

12. The display of claim 1, wherein the elongated particles comprise noble metal particles selected from the group consisting of platinum, palladium, ruthenium, rhodium, osmium, and iridium.

13. The display of claim 1, wherein the optical coating further comprises an organic solvent to provide the coating to reduce a viscosity and thickness of the optical coating.

14. The display of claim 1, wherein the elongated particles have an aspect ratio of 25:1 or more.

15. The display of claim 1, wherein the polymer is polymerized from a first compound, a second compound, and a third compound,
wherein the first compound is selected from the group consisting of diphenylsilanediol, di-isopropylsilanediol, and di-isobutylsilanediol,
wherein the second compound is 2-(3,4-Epoxycyclohexyl)ethyltrimethoxysilane, and
wherein the third compound is selected from the group consisting of tetramethoxysilane, dimethyldimethoxysilane, tetramethoxysilane, bis(trimethoxysilyl)ethane, and vinyltrimethoxysilane.

* * * * *